United States Patent [19]

Johnson et al.

[11] Patent Number: 4,514,345
[45] Date of Patent: Apr. 30, 1985

[54] METHOD OF MAKING A FORAMINOUS MEMBER

[75] Inventors: Bruce A. Johnson; Andrew J. Wnuk, both of Fairfield, Ohio

[73] Assignee: The Procter & Gamble Company, Cincinnati, Ohio

[21] Appl. No.: 525,591

[22] Filed: Aug. 23, 1983

[51] Int. Cl.³ ............................................. B29D 7/20
[52] U.S. Cl. ................................. 264/22; 264/132; 264/136; 264/233; 430/308
[58] Field of Search ............... 264/22, 49, 132, 233, 264/136; 430/308

[56] References Cited

U.S. PATENT DOCUMENTS

| | | | |
|---|---|---|---|
| 2,480,749 | 8/1949 | Marks | 264/22 |
| 2,556,504 | 6/1951 | Prestwich | 264/22 |
| 2,860,576 | 11/1958 | Short | 101/128.3 |
| 3,438,504 | 4/1969 | Furman | 264/22 |
| 3,658,620 | 4/1972 | Hall | 264/22 |
| 3,713,935 | 1/1973 | Grecchi | 264/22 |
| 3,878,019 | 4/1975 | Chapman et al. | 264/22 |
| 4,042,654 | 8/1977 | Leszyk et al. | 264/22 |
| 4,054,635 | 10/1977 | Schlesinger et al. | 264/22 |
| 4,291,116 | 9/1981 | Tibbetts | 430/308 |

FOREIGN PATENT DOCUMENTS

| | | | |
|---|---|---|---|
| 53-51253 | 5/1978 | Japan | 264/22 |
| 55-49230 | 4/1980 | Japan | 264/132 |
| 56-67226 | 6/1981 | Japan | 264/22 |
| 57-31535 | 2/1982 | Japan | 264/22 |

Primary Examiner—Jeffery Thurlow
Attorney, Agent, or Firm—Monte D. Witte; Fredrick H. Braun; Richard C. Witte

[57] ABSTRACT

A process for making relatively thick foraminous members the foramina of which form a preselected pattern. The backing film such as a thermoplastic film is placed in contact with a rotating drum. A foraminous woven element about which the foraminous member will be constructed is placed in contact with the thermoplastic backing film. Liquid photosensitive resin is supplied to a controlled thickness. A mask comprising the preselected pattern is placed adjacent the photosensitive resin and the resin is exposed through the mask to the light of an activating wavelength. Uncured resin is washed from the composite leaving behind the completed foraminous member.

15 Claims, 4 Drawing Figures

METHOD OF MAKING A FORAMINOUS MEMBER

BACKGROUND OF THE INVENTION

1. Field of the Invention

This invention relates to methods (processes) for making relatively thick foraminous members the foramina of which form a preselected pattern.

2. Background Art

Stencil screens for printing or the application of inks, pigments, and the like have been used by industry for a number of years. For example, stencil screens used in the ceramics industry generally comprise a stainless steel screen of relatively fine mesh size the interstices of which have all been closed except for those which define the design which is intended to be printed. The design is printed by placing the stencil screen in contact with the surface and forcing ink, pigment, or the like through the open meshes. Such stencil screens are conveniently prepared with the aid of a photosensitive material such as a photosensitive resin. In general, the screen is coated with a relatively thin layer of photosensitive material which is then exposed to light of the requisite wavelength through a mask or photographic film containing a positive image of the design to be printed. That is to say, the design one wishes to print appears in the mask as regions which are opaque to light. During exposure, the resin which is unprotected by the design of the mask partially cures or hardens while that portion of the resin protected by the opaque design remains uncured and fluid. The uncured, fluid portion of the resin can then be removed and washed from the screen leaving a system of open interstices defining the pattern to be printed. Numerous patents and other references describe various and sundry techniques for making stencil screens. Examples include U.S. Pat. No. 2,860,576 issued to Short on Nov. 18, 1958 and U.S. Pat. No. 4,291,116 issued to Tibbetts on Sept. 22, 1981.

Certain industrial operations other than printing also require the use of foraminous members the open regions of which define some preselected pattern. Unlike printing operations, these other industrial operations require a foraminous member having a significantly greater thickness than that provided by common stencil screens. Further, these other industrial operations sometimes require foraminous members having sizes significantly greater than those commonly found in stencil screens. In certain operations, the foraminous member is required to be in the form of an endless belt which can be, for example, 6 meters wide by 75 meters long.

SUMMARY OF THE INVENTION

The present invention is of a method of forming a foraminous member. The product of this method is a foraminous member, such as a belt, the gross foramina of which, because of their size and distribution and orientation, form a preselected pattern.

Broadly, the method involves taking a foraminous element such as a screen and using photosensitive resins to construct about and in the foraminous element a solid, polymeric framework which delineates the preselected pattern of gross foramina.

More particularly, the method of this invention comprises supplying three solid, usually planar, usually continuous materials: a foraminous element such as a woven screen; a backing film such as a thermoplastic sheet; and a mask provided with transparent and opaque regions, the opaque regions of which define the desired, preselected pattern of gross foramina. A fourth material which must be supplied during the practice of the method is a liquid photosensitive resin which cures under the influence of light of a particular activating wavelength to form a relatively insoluble, relatively durable, polymeric solid. The apparatus required for the practice of this invention comprises a usually drumlike, usually rotating, forming unit. In the practice of the invention, the backing film is applied to the working surface of the forming unit. The foraminous element is then juxtaposed the backing film in such a manner that the backing film is interposed the foraminous element and the forming unit. A coating of the liquid photosensitive resin is applied to the foraminous element to a thickness which is controlled to a preselected value. The mask is juxtaposed in contacting relation with the surface of the liquid photosensitive resin and the resin is exposed through the mask to light of an activating wavelength. Curing (as evidenced by solidification of the resin) is induced in those regions of the coating which are exposed to the activating light. Following exposure to light, the backing film and the mask are stripped away from the composite comprising the foraminous element and the resin. Finally, the uncured, still liquid photosensitive resin is removed from the composite, as by a combination of vacuum treatment and washing, leaving behind the desired foraminous member the gross foramina of which define the desired preselected pattern.

Figure 1:
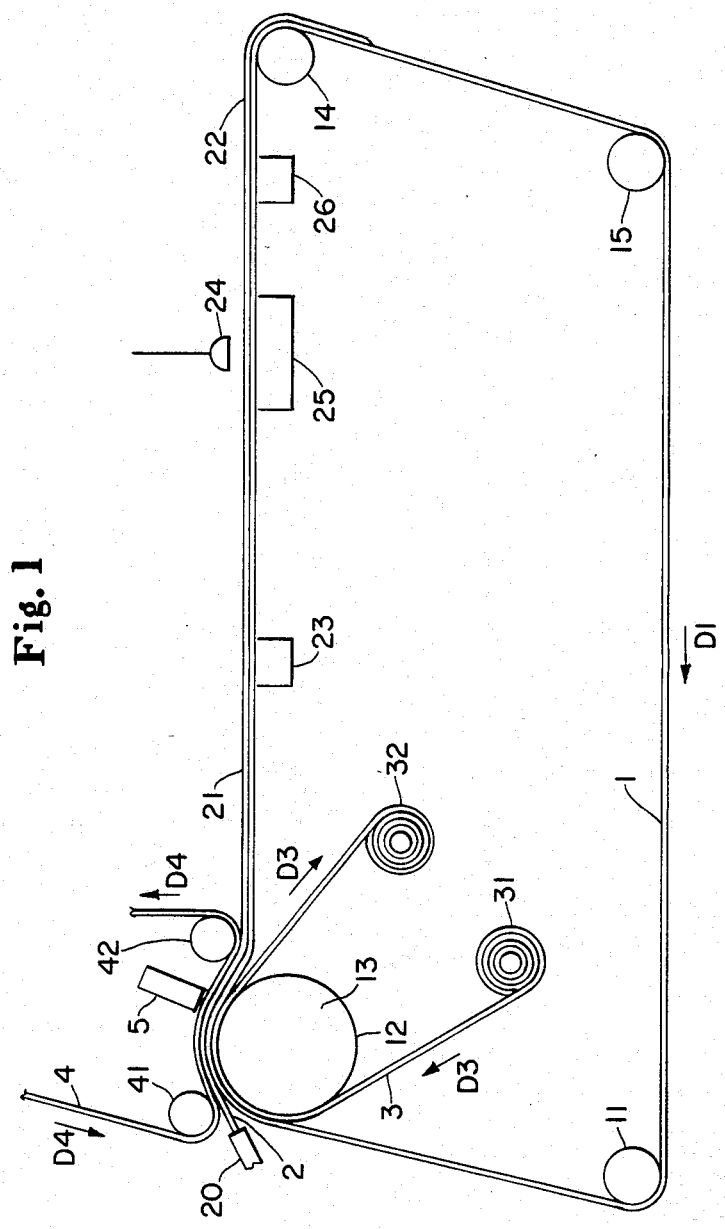
FIG. 1 is a schematic representation of a preferred embodiment of the process of this invention.

In the drawings, like features are identically designated.

DETAILED DESCRIPTION OF THE INVENTION

While this specification concludes with claims particularly pointing out and distinctly claiming that which is regarded as the invention, it is believed that the invention will be better understood through perusal of the following detailed description of the invention and the appended example in conjunction with study of the figures.

The product of the method of this invention is a foraminous member, the gross foramina of which, because of their size and distribution and orientation, form a preselected pattern. It is made by constructing in and around a foraminous element a framework defining the gross foramina.

In this specification, "gross foramina" is the term used to describe the openings in the foraminous member which, because of their size and shape and distribution, form the preselected pattern with which the foraminous member is provided. Gross foramina are provided in the foraminous member through manipulation of the photosensitive resin as described at length herein. If the foraminous member of this invention were a stencil screen, the gross foramina would define the design or pattern the screen would be used to print. Gross foramina are to be distinguished from fine foramina. "Fine foramina" is the term used herein to describe the openings present in the foraminous element about which the foraminous member is constructed. While fine foramina are usually present in some particular pattern, it is not their pattern which is referred to as the "preselected pattern" in the description of the foraminous member above; the "preselected pattern" is the pattern of the gross foramina. Typically, a fine foramen is only a fraction of the size of a gross foramen, but the alternate relationship is possible.

Figure 2:
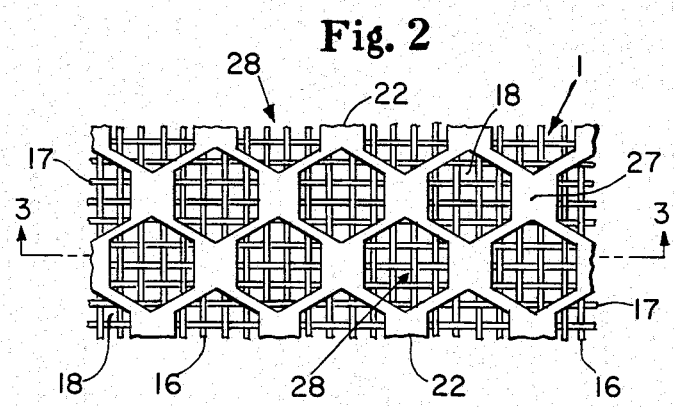
FIG. 2 is a fragmentary plan view of one embodiment of the foraminous member made by the process of this invention.

FIG. 2 illustrates a portion of one embodiment of the foraminous member produced by this invention. In this embodiment, foraminous element 1 is a screen of square weave comprising process direction filaments 16 and cross direction filaments 17. Preferably, the filaments are either round or oval in cross-section. Foraminous element 1 is provided with fine foramina 18 as defined by the interstices between process direction filaments 16 and cross direction filaments 17. In the embodiment illustrated in FIG. 2, fine foramina 18 are essentially rectangular and of uniform size and shape; there is no requirement that they be of uniform size and shape and other useful embodiments can be readily envisioned.

Figure 3:
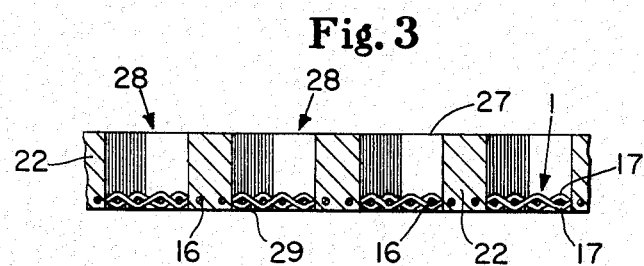
FIG. 3 is a cross sectional view of the fragment of the foraminous member illustrated in FIG. 2 taken along line 3—3.

The method of this invention is used to construct foraminous member solid framework 22 (for convenience, hereinafter referred to as simply as the "framework") about foraminous element 1. As illustrated in FIG. 2, framework 22 is continuous and defines a plurality of gross foramina 28. FIG. 3, a cross sectional view of the fragment of the foraminous member illustrated in FIG. 2 taken along line 3—3, clearly illustrates the fact that gross foramina 28 are openings extending through the entire thickness of the foraminous member.

Framework 22 is provided with upper surface 27 and lower surface 29. Preferably, framework 22 extends throughout foraminous element 1 and is so constructed that the openings of gross foramina 28 are substantially the same in upper surface 27 and lower surface 29. Upper surface 27 and lower surface 29 are planar.

In the embodiment illustrated in FIGS. 2 and 3, gross foramina 28 have the shape of hexagons. While this shape is useful in certain applications, it is used here primarily for illustrative purposes and not as a limitation.

Figure 4:
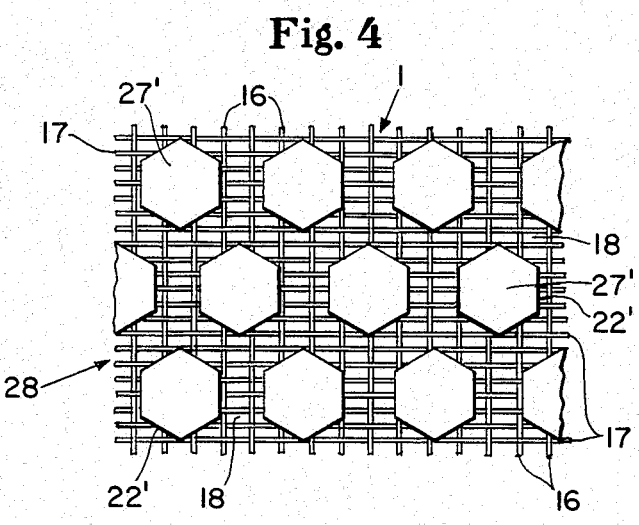
FIG. 4 is a fragmentary plan view of an alterate embodiment of the foraminous member made by the process of this invention.

FIG. 4 is similar to FIG. 2 and illustrates an alternate embodiment of a foraminous member made by the process of this invention. Here, framework 22' comprises a plurality of hexagonal elements dispersed across foraminous element 1. In this embodiment, gross foramina 28 (or, more properly, gross foramen 28) take the form of a continuous opening in which solid islands of framework 22' have been dispersed.

These two examples (in FIGS. 2 and 4) are presented to indicate that the nature of the preselected pattern of the gross foramina is virtually unlimited.

As noted above, the present invention is of a continuous process for making thick foraminous members the foramina of which form a preselected pattern. In broad outline, the method involves using a photosensitive resin to construct in and about a foraminous element a solid, polymeric framework which delineates the preselected pattern of the gross foramina of the foraminous member.

More particularly, the present method comprises the steps of:

a. Applying a backing film to the working surface of a forming unit;

b. Juxtaposing a foraminous element to the backing film so that the backing film is interposed between the foraminous element and the forming unit;

c. Applying a coating of liquid photosensitive resin to the surfaces of the foraminous element;

d. Controlling the thickness of the coating to a preselected value;

e. Juxtaposing in contacting relationship with the coating of photosensitive resin a mask comprising both opaque and transparent regions where the opaque regions define the preselected pattern;

f. Exposing the liquid photosensitive resin to light having an activating wavelength through the mask thereby inducing curing of the photosensitive resin in those regions which are in register with the transparent regions of the mask; and g. Removing from the foraminous element substantially all the uncured liquid photosensitive resin.

The exact apparatus (or equipment) used in the practice of the present invention is immaterial so long as it can, in fact, be used to practice the present invention. After reading the whole of this specification, one of ordinary skill of the art will be able to select appropriate apparatus to perform the steps indicated above. A preferred embodiment of an apparatus which can be used in the practice of this invention to construct a foraminous member in the form of an endless belt is shown in schematic outline in FIG. 1. For convenience, the invention will be described in terms of that apparatus.

The first step of the process of the present invention is applying a backing film to the working surface of a forming unit.

In FIG. 1, forming unit 13 has working surface 12 and is indicated as being a circular element; it is preferably a drum. The diameter of the drum and its length are selected for convenience. Its diameter should be great enough so that the backing film and the foraminous element are not unduly curved during the process. It must also be large enough in diameter that there is sufficient distance of travel about its surface so that the necessary steps can be accomplished as the drum is rotating. The length of the drum is selected according to the width of the foraminous member being constructed. Forming unit 13 is rotated by a drive means not illustrated. Optionally, and preferably, working surface 12 absorbs light of the activating wavelength.

Preferably, forming unit 13 is provided with means for insuring that backing film 3 is maintained in close contact with working surface 12. Backing film 13 can be, for example, adhesively secured to working surface 12 or forming unit 13 can be provided with means for securing backing film 3 to working surface 12 through the influence of a vacuum applied through a plurality of closely spaced, small orifices across working surface 12 of forming unit 13. Preferably, backing film 3 is held against working surface 12 by tensioning means not shown in FIG. 1.

Backing film 3 is introduced into the system from backing film supply roll 31 by unwinding it therefrom and causing it to travel in the direction indicated by directional arrow D3. Backing film 3 contacts working surface 12 of forming unit 13, is temporarily constrained against working surface 12 by the means discussed hereinbefore, travels with forming unit 13 as the latter rotates, is eventually separated from working surface 12, and travels to backing film take-up roll 32 where it is rewound. In the embodiment of the process illustrated in FIG. 1, backing film 3 is designed for a single use after which it is discarded. In an alternate arrangement, backing film 3 takes the form of an endless belt traveling about series of return rolls where it is cleaned as appropriate and reused. Necessary drive means, guide rolls, and the like are not illustrated in FIG. 1.

The function of the backing film is to protect the working surface of the forming unit and to facilitate removal of the partially completed foraminous member from the forming unit. The film can be any flexible, smooth, planar material such as polyethylene or polyester sheeting. Preferably, the backing film is made from polypropylene and is from about 0.01 to about 0.1 millimeter (mm) thick. Preferably, backing film 3 absorbs light of the activating wavelength.

The second step of the process of the present invention is the juxtaposing of a foraminous element to the backing film in such a way that the backing film is interposed between the foraminous element and the forming unit.

The foraminous element is the material about which the foraminous member is constructed. One suitable foraminous member is shown to be a screen as illustrated in FIGS. 2 and 3. Screens having mesh sizes from of about 6 to about 30 filaments per centimeter and constructed of polyester filaments are suitable. Square weave screens are suitable as are screens of other, more complex weaves. Filaments having either round or oval cross sections are preferred. It is not necessary that the filaments be transparent to light of the activating wavelength.

In addition to screens, foraminous elements can be provided by woven and nonwoven fabrics, thermoplastic netting, and the like. The precise nature of the foraminous element selected and its dimensions will be dictated by the use of which the foraminous member will be placed after it is constructed.

Since the foraminous member constructed by the apparatus illustrated in FIG. 1 is in the form of an endless belt, foraminous element 1 should also be an endless belt. As illustrated, foraminous element 1 travels in the direction indicated by directional arrow D1 about return roll 11 up, over, and about forming unit 13 and about return rolls 14 and 15. Other guide rolls, return rolls, drive means, support rolls and the like are not shown in FIG. 1.

Foraminous element 1 is juxtaposed backing film 3 so that backing film 3 is interposed between foraminous element 1 and forming unit 13. The specific design desired for the foraminous member will dictate the exact method of juxtaposition. In the preferred embodiment, foraminous element 1 is placed in direct contacting relation with backing film 3. When the liquid photosensitive resin is applied to foraminous element 1, the resin will be disposed principally to one side of foraminous element 1 and foraminous element 1 will, in effect, be located at one surface of the foraminous member. Foraminous element 1 can be spaced some finite distance from backing film 3 by any convenient means, but such arrangement is not usually preferred.

The third step in the process of this invention is the application of a coating of liquid photosensitive resin 2 to the foraminous element. Any technique by which the liquid material can be applied to the foraminous element is suitable. For example, nozzle 20 can be used. It is necessary that liquid photosensitive resin 2 be evenly applied across the width of foraminous element 1 and that of the requisite quantity of material be worked through fine foramina 18 as the design of the foraminous member requires. Since the knuckles of the foraminous element are preferably in contact with the backing film, it will frequently not be possible to completely encase the whole of each filament with photosensitive resin; as much of each filament as possible should, however, be encased.

Suitable photosensitive resins can be readily selected from the many available commercially. They are materials, usually polymers, which cure or cross-link under the influence of radiation, usually ultraviolet (UV) light. References containing more information about liquid photosensitive resins include Green et al, "Photocrosslinkable Resin Systems", J. Macro-Sci. Revs. Macro Chem., C21 (2), 187–273 (1981–82); Bayer, "A Review of Ultraviolet Curing Technology", Tappi Paper Synthetics Conf. Proc., Sept. 25–27, 1978, pp. 167–172; and Schmidle, "Ultraviolet Curable Flexible Coatings", J. of Coated Fabrics, 8, 10–20 (July, 1978). All the preceeding three references are incorporated herein by reference. Especially preferred liquid photosensitive resins are included in the Merigraph series of resins made by Hercules Incorporated, Wilmington, Del.

The next step in the process of this invention is controlling the thickness of the coating to a preselected value. The preselected value corresponds, naturally, to the thickness desired for the foraminous member. This thickness, also naturally, follows from the expected use of the foraminous member. When the foraminous member is to be used in the papermaking process described hereinafter, it is preferred that the member be from about 0.35 mm to about 3.0 mm thick. Other applications, of course, can require thicker foraminous members which can be 3 centimeters thick or thicker. Any suitable means for controlling the thickness can be used. Illustrated in FIG. 1 is the use of nip roll 41. The clearance between nip roll 41 and forming unit 13 can be controlled mechanically by means not shown. The nip, in conjunction with mask 4 and mask guide roll 42, tends to smooth the surface of liquid photosensitive resin 2 and to control its thickness.

The fifth step in the process of the invention comprises juxtaposing a mask in contacting relation with the liquid photosensitive resin. The purpose of the mask is to shield certain areas of the liquid photosensitive resin from exposure to light. Naturally, if certain areas are shielded, it follows that certain areas are not shielded and that liquid photosensitive resin in those unshielded areas will be exposed later to activating light and will be cured. The shaded regions normally comprise the preselected pattern of the gross foramina.

Mask 4 can be any suitable material which can be provided with opaque and transparent regions. A material in the nature of a flexible photographic film is suitable. The flexible film can be polyester, polyethylene, or cellulosic or any other suitable material. The opaque regions can be applied to mask 4 by any convenient means such as photographic or gravure, flexographic, or rotary screen printing. Mask 4 can be an endless loop (the details of which are not shown) or it can be supplied from one supply roll and transverse the system to a takeup roll, neither of which is shown in the illustration. Mask 4 travels in the direction indicated by directional arrow D4, turns under nip roll 41 where it is brought into contact with the surface of liquid photosensitive resin 2, travels to mask guide roll 42 in the vicinity of which it is removed from contact with the resin. In this particular embodiment, the control of the thickness of the resin and the juxtaposition of the mask occur simultaneously.

The sixth step of the process of this invention comprises exposing the liquid photosensitive resin to light of an activating wavelength through the mask thereby inducing curing of the resin in those regions which are in register with the transparent regions with the mask. In the embodiment illustrated in FIG. 1, backing film 3, foraminous element 1, liquid photosensitive resin 2, and mask 4 all form a unit traveling together from nip roll 41 to the vicinity of mask guide roll 42. Intermediate nip roll 41 and mask guide roll 42 and positioned at a location where backing film 3 and foraminous element 1 are still juxtaposed forming unit 13, liquid photosensitive resin 2 is exposed to light of an activating wavelength as supplied by exposure lamp 5. Exposure lamp 5, in general, is selected to provide illumination primarily within the wavelength which causes curing of the liquid photosensitive resin. That wavelength is a characteristic of the liquid photosensitive resin. Any suitable source of illumination, such as mercury arc, pulsed xenon, electrodeless, and fluorescent lamps, can be used. As described above, when the liquid photosensitive resin is exposed to light of the appropriate wavelength, curing is induced in the exposed portions of the resin. Curing is generally manifested by a solidification of the resin in the exposed areas. Conversely, the unexposed regions remain fluid.

The intensity of the illumination and its duration depend upon the degree of curing required in the exposed areas. The absolute values of the exposure intensity and time depend upon the chemical nature of the resin, its photo characteristics, the thickness of the resin coating, and the pattern selected. Further, the intensity of the exposure and the angle of incidence of the light can have an important effect on the presence or absence of taper in the walls of the preselected pattern.

The seventh and last step in the process in the present invention is removing from the foraminous element substantially all of the uncured liquid photosensitive resin. That is to say, the resin which has been shielded from exposure to light is removed from the system.

In the embodiment shown in FIG. 1, at a point in the vicinity of mask guide roll 42, mask 4 and backing film 3 are physically separated from the composite comprising foraminous element 1 and the now partly cured resin 21. The composite of foraminous element 1 and partly cured resin 21 travels to the vicinity of first resin removal shoe 23. A vacuum is applied to one surface of the composite at first resin removal shoe 23 so that a substantial quantity of the liquid (uncured) photosensitive resin is removed from the composite.

As the composite travels farther, it is brought into the vicinity of resin wash shower 24 and resin wash station drain 25 at which point the composite is thoroughly washed with water or other suitable liquid to remove essentially all of the remaining liquid (uncured) photosensitive resin which is discharged from the system through resin wash station drain 25. At second resin removal shoe 26, any residual wash liquid and liquid resin is removed from the composite by the application of vacuum. At this point, the composite now comprises essentially foraminous element 1 and the associated framework 22 and represents the foraminous member which is the product of this process. Optionally, but not shown in FIG. 1, there can be a second exposure of the resin to activating light so as to complete the curing of the resin and to increase the hardness and durability of the cured resin framework.

The process continues until such time as the entire length of foraminous element 1 has been treated and converted into the foraminous member.

Should it be desired to construct a member having different patterns superimposed one on another or having patterns of different thicknesses, the member can be subjected to multiple passes through the process. Multiple passes through the process of this invention can also be used to construct foraminous members of relatively great thickness.

One use of the foraminous member made by the process of this invention is in the production of an improved paper web. The improved paper web is characterized as having two regions: one is a network region, the other a plurality of domes (or protubrances). The network region is continuous, is macroscopically monoplanar, and forms a preselcted pattern. The network region completely encircles the domes and isolates one dome from another. The domes are dispersed throughout the whole of the network region. In certain embodiments, the network region has a relatively low basis weight and a relatively high density while the domes have relatively high basis weights and relatively low densities. This improved paper exhibits good absorbency, softness, tensile strength, burst strength, bulk, and, depending upon the preselected pattern of the network region, the ability to stretch in the machine direction, the cross machine direction, and in intermediate directions.

This paper is made by a process which comprises the steps of:

(a.) Providing an aqueous dispersion of papermaking fibers;

(b.) Forming an embryonic web of the papermaking fibers from the aqueous dispersion on a Fourdinier Wire;

(c.) Associating the embryonic web with the upper surface of a foraminous member made by the process of the present invention;

(d.) Deflecting the papermaking fibers in the embryonic web into the gross foramina of the foraminous member and removing water from the embryonic web through the gross and the fine foramina so as to form an intermediate web of papermaking fibers under such conditions that the deflection of the papermaking fibers is initiated no later than the time at which the water removal through the foramina is initiated;

(e.) Drying the intermediate web; and (f.) Foreshortening the web.

Conventional papermaking fibers can be used and the aqueous dispersion can be formed in conventional ways. Conventional papermaking equipment and processes can be used to form the embryonic web on the Fourdinier wire. The association of the embryonic web with the foraminous member can be accomplished by simple transfer of the web between two moving endless belts as assisted by differential fluid pressure. The papermaking fibers are deflected into the gross foramina by the application of differential fluid pressure induced by an applied vacuum. Any technique, such as the use of a Yankee drum dryer, can be used to dry the intermediate web. Foreshortening can be accomplished by any conventional technique such as creping.

In the practice of this particular papermaking process, the framework of the foraminous member should be continuous and the upper surface should be essentially macroscopically monoplanar. The individual gross foramina should be essentially separated one from another and isolated one from another by the framework. The preselected pattern of the framework can be any convenient pattern; a pattern which defines the gross foramina as biaxially staggered regular hexagons is a suitable pattern.

The following example is presented for illustrative purposes and not by way of limitation.

EXAMPLE

A foraminous member is formed according to the process of this invention on equipment similar to that illustrated in FIG. 1.

The foraminous woven element about which the foraminous member is constructed is a polyester simple (2S) weave fabric made from filaments 0.18 mm in diameter. The fabric has 17 filaments per centimeter in the direction of travel through the process and 18 filaments per centimeter in the direction perpendicular to the direction of travel. It is about 53.3 centimeters wide and about 22.2 meters long and is formed into an endless belt.

The backing film is 0.038 mm thick biaxially oriented polypropylene.

The photosensitive resin is Merigraph FF-190 resin which is used at room temperature as received from the manufacturer.

The mask is 0.038 mm thick mylar film and is printed with a hexagonal design similar to that illustrated in FIG. 2. The opaque hexagonal regions are about 1.6 mm in length from point to point. These opaque regions are produced on the mask by conventional rotary screen printing.

The forming unit is a drum which is about 106.7 cm in diameter and about 76.2 cm long. It rotates with a surface velocity of about 2.12 meters/minute.

Photosensitive resin is applied through a nozzle and is controlled to an overall thickness of about 0.61 mm by the mask and the nip roll.

The exposure lamp is a model F450-30 ultraviolet light using a mercury vapor bulb as manufactured by Fusion Systems Corporation of Rockville, Md. It has an intensity of about 118 watts/cm. The exposure lamp is placed about 25.4 cm from the mask and the exposure is controlled by an aperture which extends the width of the forming unit and which extends about 7.6 cm in the direction of travel. The aperture is positioned about 12 mm from the mask.

After the resin is exposed to UV light, uncured resin is washed from the composite by water at a temperature of about 70° C. and a flow rate of about 1.5 liters per minute per centimeter of width of composite. The composite is subjected to a post cure immediate following the shower. The post cure is provided with a lamp comprising 2 Voltarc mercury arc bulbs as made by Voltarc Tubes, Inc. of Fairfield, Conn., each bulb having an intensity of about 79 watts/cm. At the time of post cure, the composite is submerged under about 2.5 cm of water. The post cure lamp is about 12.7 cm from the composite.

The resulting foraminous member is essentially planar on both surfaces and faithfully reproduces the hexagonal pattern. It is suitable for use in the papermaking process described hereinbefore.

What is claimed is:

1. A continuous method of making a foraminous member the gross foramina of which define a preselected pattern, said method comprising the steps of
   (a) Applying a backing film to the working surface of a forming unit;
   (b) Juxtaposing a foraminous element to said backing film so that said backing film is interposed said foraminous element and said forming unit;
   (c) Applying a coating of liquid photosensitive resin to the surfaces of said foraminous element;
   (d) Controlling the thickness of said coating to a preselected value;
   (e) Juxtaposing a mask in contacting relation with said coating of said liquid photosensitive resin, said mask comprising opaque and transparent regions, said opaque regions defining therein said preselected pattern;
   (f) Exposing said coating of said liquid photosensitive resin to light having an activating wavelength through said mask thereby inducing curing of said liquid photosensitive resin in those regions thereof in register with said transparent regions; and
   (g) Removing from said foraminous element substantially all uncured liquid photosensitive resin.

2. The method of claim 1 wherein said foraminous element is in direct contact with said backing film.

3. The method of claim 2 wherein said foraminous element comprises a screen woven from filaments.

4. The method of claim 3 wherein said filaments are selected from the group consisting of filaments having round cross sections and filaments having oval cross sections.

5. The method of claim 4 wherein at least one of said backing film and said working surface absorbs light of the activating wavelength.

6. The method of claim 5 wherein said filaments are opaque to light of the activating wavelength.

7. The method of claim 6 wherein said method comprises an additional step following said removing step wherein said additional step consists of exposing the cured photosensitive resin to light of an activating wavelength thereby inducing further curing of said resin.

8. The method of claim 1 wherein at least one of said backing film and said working surface absorbs light of the activating wavelength.

9. The method of claim 8 wherein said method comprises an additional step following said removing step wherein said additional step consists of exposing the cured photosensitive resin to light of an activating wavelength thereby inducing further curing of said resin.

10. The method of claim 1 wherein said method comprises an additional step following said removing step wherein said additional step consists of exposing the cured photosensitive resin to light of an activating wavelength thereby inducing further curing of said resin.

11. The method of claim 1 wherein said foraminous element comprises a screen woven from filaments.

12. The method of claim 11 wherein said filaments are selected from the group consisting of filaments having round cross sections and filaments having oval cross sections.

13. The method of claim 12 wherein said filaments are opaque to light of the activating wavelength.

14. The method of claim 13 wherein at least one of said backing film and said working surface absorbs light of the activating wavelength.

15. The method of claim 14 wherein said method comprises an additional step following said removing step wherein said additional step consists of exposing the cured photosensitive resin to light of an activating wavelength thereby inducing further curing of said resin.

* * * * *